(12) United States Patent
Ichikawa et al.

(10) Patent No.: US 11,620,922 B2
(45) Date of Patent: Apr. 4, 2023

(54) DISPLAY DEVICE

(71) Applicant: SHARP KABUSHIKI KAISHA, Sakai (JP)

(72) Inventors: Shinji Ichikawa, Sakai (JP); Tohru Okabe, Sakai (JP); Shinsuke Saida, Sakai (JP); Ryosuke Gunji, Sakai (JP); Hiroki Taniyama, Sakai (JP); Yoshihiro Nakada, Yonago (JP); Hiroharu Jinmura, Yonago (JP); Akira Inoue, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 267 days.

(21) Appl. No.: 16/651,346

(22) PCT Filed: Sep. 29, 2017

(86) PCT No.: PCT/JP2017/035505
§ 371 (c)(1),
(2) Date: Mar. 26, 2020

(87) PCT Pub. No.: WO2019/064497
PCT Pub. Date: Apr. 4, 2019

(65) Prior Publication Data
US 2020/0273380 A1    Aug. 27, 2020

(51) Int. Cl.
*G09F 9/30*    (2006.01)
*H01L 27/32*    (2006.01)

(52) U.S. Cl.
CPC .......... *G09F 9/301* (2013.01); *H01L 27/3227* (2013.01)

(58) Field of Classification Search
CPC . G09F 9/301; H01L 27/3227; H01L 51/5253; H01L 51/0097; H01L 2251/5338; H01L 27/3276; H05B 33/12
See application file for complete search history.

(56) References Cited

U.S. PATENT DOCUMENTS

| | | | | |
|---|---|---|---|---|
| 10,732,674 B2* | 8/2020 | Lee | ...................... | H01L 51/5253 |
| 10,840,463 B2* | 11/2020 | Sano | ....................... | B32B 27/36 |
| 10,930,723 B2* | 2/2021 | Shim | .................... | H01L 27/3265 |
| 10,957,753 B2* | 3/2021 | Eo | ........................ | H01L 51/5253 |
| 11,088,284 B2* | 8/2021 | Son | ...................... | H01L 29/7869 |
| 11,171,198 B2* | 11/2021 | Ohara | ............... | G02F 1/136286 |
| 2012/0146886 A1* | 6/2012 | Minami | ............... | G09G 3/3266 |
| | | | | 345/80 |

(Continued)

FOREIGN PATENT DOCUMENTS

JP    2011-209405 A    10/2011
JP    2011209405 A  *  10/2011

(Continued)

*Primary Examiner* — S M Sohel Imtiaz
(74) *Attorney, Agent, or Firm* — ScienBiziP, P.C.

(57) ABSTRACT

In a cross section of a bending section of a frame region, a first opening opening upward is formed in at least one layer of inorganic film included in a TFT layer. A first organic film is provided to plug the first opening. A frame wiring line is provided on the first organic film. A second organic film is provided to cover the frame wiring line. A second opening opening upward is formed in the first organic film on an inner side with respect to the first opening.

10 Claims, 5 Drawing Sheets

(56) References Cited

U.S. PATENT DOCUMENTS

| | | | | |
|---|---|---|---|---|
| 2015/0183932 A1* | 7/2015 | Katayama | ............. | H05B 33/04 |
| | | | | 438/34 |
| 2016/0244565 A1 | 8/2016 | Katayama et al. | | |
| 2017/0240707 A1 | 8/2017 | Katayama et al. | | |
| 2017/0288007 A1* | 10/2017 | Shin | ..................... | G02F 1/1345 |
| 2018/0097019 A1* | 4/2018 | Gunji | ................... | H01L 27/124 |

FOREIGN PATENT DOCUMENTS

| JP | 2012-128006 A | | 7/2012 |
|---|---|---|---|
| JP | 2014-026969 A | | 2/2014 |
| JP | 2016-173461 A | | 9/2016 |
| JP | 2016173461 A | * | 9/2016 |
| JP | 2016-224118 A | | 12/2016 |
| JP | 2016224118 A | * | 12/2016 |

\* cited by examiner

DISPLAY DEVICE

TECHNICAL FIELD

The disclosure relates to a display device.

BACKGROUND ART

In recent years, organic EL display devices, which use organic electroluminescence (EL) elements and are of the self-luminous type, have attracted attention as a display device that can replace the liquid crystal display device. As the organic EL display device, an organic EL display device having flexibility, in which an organic EL element or the like is layered on a flexible resin substrate has been proposed.

For example, PTL 1 discloses a display device including a gas barrier layer on a support substrate formed of a polyimide film having a transmittance and a thermal expansion coefficient that fall within predetermined ranges.

CITATION LIST

Patent Literature

PTL 1: JP 2014-26969 A

SUMMARY OF INVENTION

Technical Problem

Incidentally, in an organic EL display device, it is desirable that a rectangular display region for displaying an image and a frame region formed in a periphery of the display region be provided and that the frame region be reduced. Further, in the flexible organic EL display device, for example, in a case where the frame region is reduced by bending the frame region being on a terminal side, a wiring line arranged in a bending section of the frame region may be broken. Thus, at the bending section in the flexible organic EL display device, there may be a case in which a base coat film provided on the resin substrate, and inorganic films such as a gate insulating film and an interlayer insulating film are removed, a flattening film formed of an organic material is formed at a portion where the removal takes place, a wiring line is formed on the flattening film, and another flattening film formed of an organic material is formed on the wiring line. However, in the flexible organic EL display device having such configuration, the flattening film is increased in thickness. Thus, even in a case where breakage of the wiring line at the bending section of the frame region is suppressed, bending may be difficult to perform at the bending section of the frame region.

SUMMARY

Technical Problem

The disclosure has been made in view of the above, and an object of the disclosure is to improve bendability at the bending section of the frame region.

In order to achieve the above object, a display device according to the disclosure includes a resin substrate, a light-emitting element included in a display region, the light-emitting element being provided above the resin substrate with a TFT layer in between, a frame region provided in a periphery of the display region, a terminal section provided at an end of the frame region, a bending section provided between the display region and the terminal section, a frame wiring line provided in the frame region, the frame wiring line extending to the terminal section with being electrically coupled to the light-emitting element via the TFT layer, and an at least one layer of inorganic film provided in the frame region, the at least one layer of inorganic film being included in the TFT layer layered on the resin substrate, wherein the at least one layer of inorganic film, a first organic film, the frame wiring line, and a second organic film are provided in the stated order from the display region to the terminal section, in a cross section at the bending section, a first opening that opens upward is formed in the at least one layer of inorganic film, the first organic film is provided to plug the first opening, the frame wiring line is provided on the first organic film, the second organic film is provided to cover the frame wiring line, and a second opening that opens upward is formed in the first organic film on an inner side with respect to the first opening.

ADVANTAGEOUS EFFECTS OF DISCLOSURE

According to the disclosure, in a cross section of the bending section of the frame region, the first opening that opens upward is formed in at least one layer of inorganic film included in the TFT layer. The first organic film is provided to plug the first opening. The frame wiring line is provided on the first organic film. The second organic film is provided to cover the frame wiring line. The second opening that opens upward is formed in the first organic film on an inner side with respect to the first opening. Thus, bendability at the bending section of the frame region can be enhanced.

Embodiments of the disclosure will be described below in detail with reference to the drawings. The disclosure is not limited to the embodiments described below.

FIRST EMBODIMENT

Figure 1:
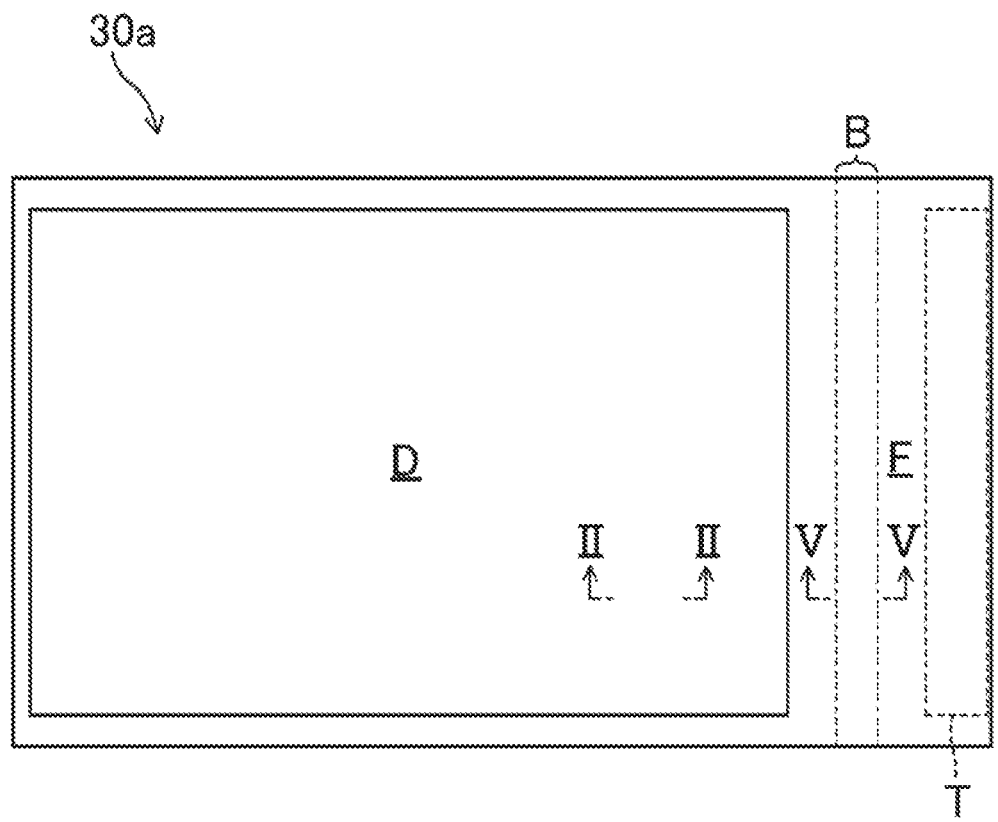
FIG. 1 is a plan view illustrating an overall configuration of an organic EL display device according to a first embodiment of the disclosure.
Figure 2:
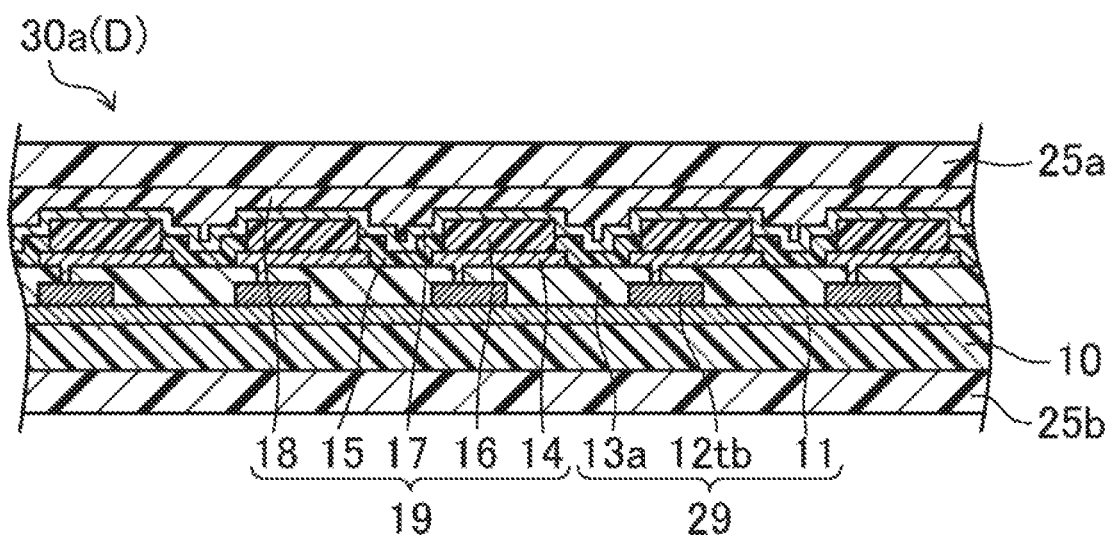
FIG. 2 is a cross-sectional view illustrating an overall configuration of a display region of the organic EL display device, which is taken along the line II-II in FIG. 1.
Figure 3:
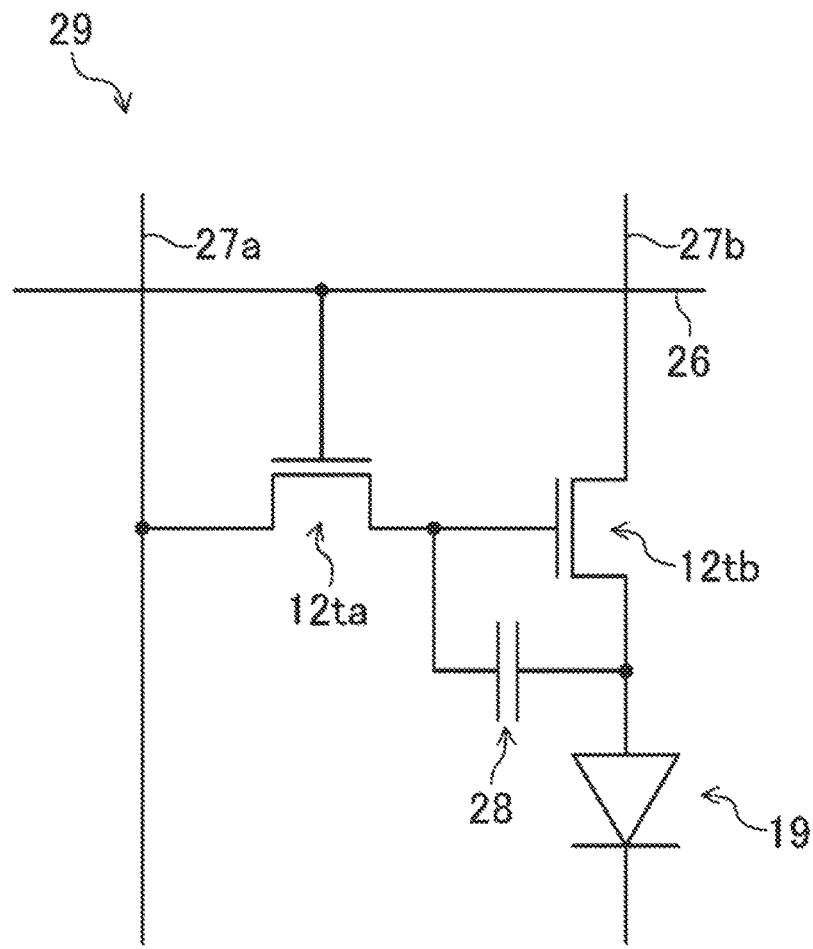
FIG. 3 is an equivalent circuit diagram of a TFT layer included in the organic EL display device according to the first embodiment of the disclosure.
Figure 4:
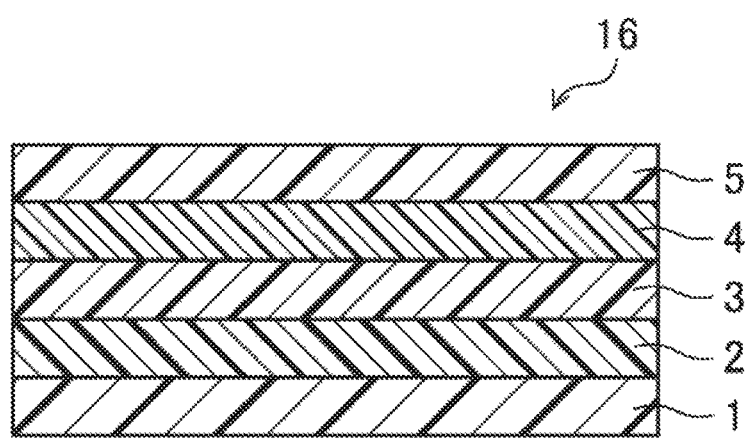
FIG. 4 is a cross-sectional view illustrating an organic EL layer included in the organic EL display device according to the first embodiment of the disclosure.
Figure 5:
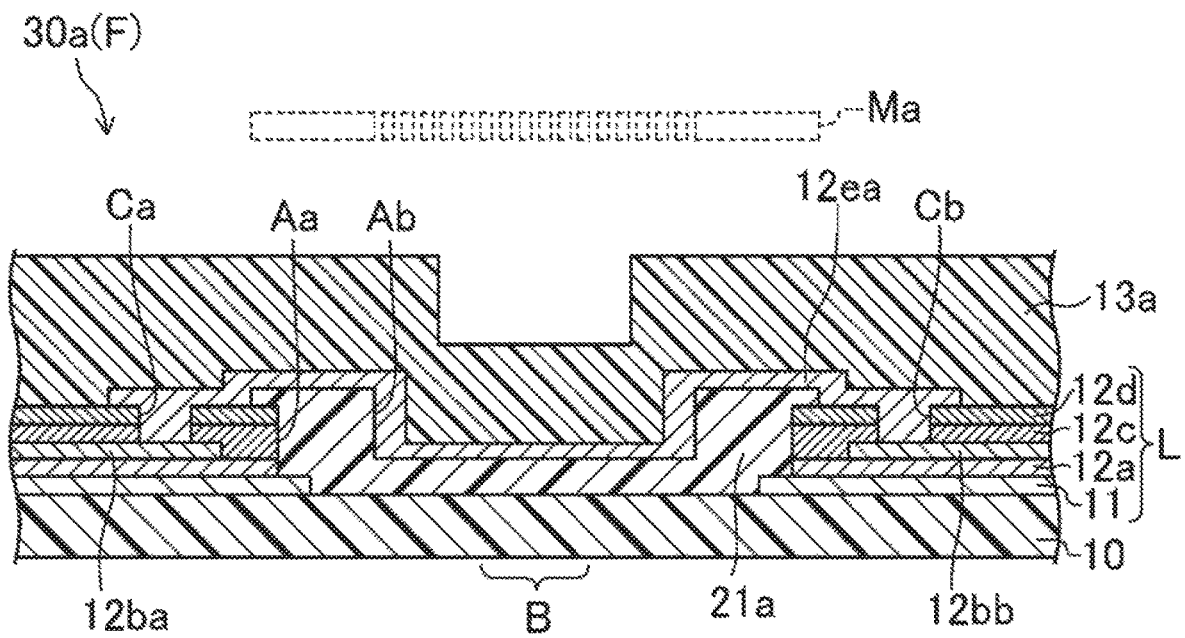
FIG. 5 is a cross-sectional view illustrating an overall configuration of a frame region of the organic EL display device, which is taken along the line V-V in FIG. 1.

FIG. 1 to FIG. 5 illustrate a display device according to a first embodiment of the disclosure. Note that, in each of the following embodiments, an organic EL display device including an organic EL element will be described as a display device including a light-emitting element. Here, FIG. 1 is a plan view illustrating an overall configuration of an organic EL display device 30a according to the present embodiment. FIG. 2 is a cross-sectional view illustrating an overall configuration of a display region D of the organic EL display device 30a, which is taken along the line II-II in FIG. 1. FIG. 3 is an equivalent circuit diagram of a TFT layer 29 included in the organic EL display device 30a. FIG. 4 is a cross-sectional view of an organic EL layer 16 included in the organic EL display device 30a. FIG. 5 is a cross-sectional view illustrating an overall configuration of a frame region F of the organic EL display device 30a, which is taken along the line V-V in FIG. 1.

As illustrated in FIG. 1, the organic EL display device 30a includes the display region D defined in a rectangular shape for displaying an image, and the frame region F defined in the periphery of the display region D. Here, as illustrated in FIG. 2, the display region D of the organic EL display device 30a is provided with organic EL elements 19 and a plurality of pixels arranged in a matrix pattern. Note that each of the pixels in the display region D includes, for example, a subpixel for display of red grayscale, a subpixel for display of green grayscale, and a subpixel for display of blue grayscale. These subpixels are arrayed adjacent to one another. As illustrated in FIG. 1, a terminal section T is provided at the right end portion of the frame region F in the figure. As illustrated in FIG. 1, between the display region D and the terminal section T in the frame region F, a bending section B bendable at 180 degrees (in a U shape) about a bending axis J being the vertical direction in the figure (see FIG. 8 described alter) is provided to be along one side (right side in the figure) of the display region D.

As illustrated in FIG. 2, the organic EL display device 30a includes, in the display region D, a resin substrate layer 10, a TFT layer 29 provided on the front surface of the resin substrate layer 10, the organic EL element 19 provided, as a light-emitting element, on the front surface of the TFT layer 29, a front surface side protection layer 25a provided on the front surface of the organic EL element 19, and a back surface side protection layer 25b provided on the back surface of the resin substrate layer 10.

The resin substrate layer 10 is provided as a resin substrate, and is formed of, for example, a polyimide resin having a thickness of approximately from 10 μm to 20 μm.

As illustrated in FIG. 2, the TFT layer 29 includes a base coat film 11 provided on the resin substrate layer 10, a plurality of first TFTs 12ta (see FIG. 3) and a plurality of second TFTs 12tb that are provided on the base coat film 11, and a TFT flattening film 13a provided on the first TFTs 12ta and the second TFTs 12tb. As illustrated in FIG. 3, the TFT layer 29 is provided with a plurality of gate lines 26 provided to extend in parallel to one another in the horizontal direction in the figure. As illustrated in FIG. 3, the TFT layer 29 is also provided with a plurality of source lines 27a provided to extend in parallel to one another in the vertical direction in the figure. As illustrated in FIG. 3, the TFT layer 29 is further provided with a plurality of power supply lines 27b each provided adjacent to each source line 27a to extend in parallel to one another in the vertical direction in the figure. As illustrated in FIG. 3, the TFT layer 29 is further provided with, in each subpixel, the first TFT 12ta, the second TFT 12tb, and a capacitor 28.

The base coat film 11 is made up of a single-layer film or a layered film of an inorganic insulating film of, for example, silicon nitride, silicon oxide, silicon oxide nitride, or the like.

As illustrated in FIG. 3, the first TFT 12ta is connected to respective gate line 26 and source line 27a in each subpixel. As illustrated in FIG. 3, the second TFT 12tb is connected to respective first TFT 12ta and power supply line 27b in each subpixel. The first TFT 12ta and the second TFT 12tb each include, for example, semiconductor layers provided in an island pattern on the base coat film 11, a gate insulating film 12a (see FIG. 5) provided to cover the semiconductor layers, a gate electrode provided to partially overlap with the semiconductor layers on the gate insulating film 12a, a first interlayer insulating film 12c and a second interlayer insulating film 12d (see FIG. 5) provided to cover the gate electrode, and a source electrode and a drain electrode provided in a manner spaced apart from each other on the second interlayer insulating film 12d. Note that, although in the first embodiment, the top-gate type is described as an example of the first TFT 12ta and the second TFT 12tb, the first TFT 12ta and the second TFT 12tb may be of the bottom-gate type.

The gate insulating film 12a, the first interlayer insulating film 12c, and the second interlayer insulating film 12d are formed of a single-layer film or a layered film of an inorganic insulating film of, for example, silicon nitride, silicon oxide, silicon oxide nitride, or the like.

As illustrated in FIG. 3, the capacitor 28 is connected to the respective first TFT 12ta and power supply line 27b in each subpixel. Here, the capacitor 28 is formed of, for example, one electrode formed of the same material in the same layer as the gate electrode of the first TFT 12ta (second TFT 12tb), the other electrode formed of the same material in the same layer as the source electrode and the drain electrode of the first TFT 12ta (second TFT 12tb), and the first interlayer insulating film 12c and/or the second interlayer insulating film 12d (see FIG. 5) provided between the pair of these electrodes.

The TFT flattening film 13a is formed of, for example, a colorless and transparent organic insulating film formed of a polyimide resin, an acrylic resin, or the like having a thickness of approximately from 2 μm to 2.5 μm.

As illustrated in FIG. 2, the organic EL element 19 includes a plurality of first electrodes 14, an edge cover 15, a plurality of organic EL layers 16, a second electrode 17, and a sealing film 18, which are provided in the order stated, over the TFT flattening film 13a.

As illustrated in FIG. 2, the plurality of first electrodes 14 are provided, each corresponding to each subpixel, in a matrix pattern over the TFT flattening film 13a. As illustrated in FIG. 2, the first electrode 14 is connected to the drain electrode of the second TFT 12tb via a contact hole formed through the TFT flattening film 13a. The first electrode 14 functions to inject holes into the organic EL layer 16. It is further preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Examples of materials that constitute the first electrode 14 may include alloys such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Examples of materials that may be included in the first electrode 14 include electrically conductive oxides, examples of which include tin oxide (SnO), zinc oxide (ZnO), indium tin oxide (ITO), and indium zinc oxide (IZO). The first electrode 14 may include a stack of a plurality of layers of any of the above-mentioned materials. Note that, examples of materials having a large work function include indium tin oxide (ITO) and indium zinc oxide (IZO).

As illustrated in FIG. 2, the edge cover 15 is provided in a lattice pattern and surrounds the outer perimeter portion of each first electrode 14. Here, examples of materials that constitute the edge cover 15 include an inorganic film, for example, a silicon oxide ($SiO_2$) film, a silicon nitride (SiNx (x is a positive number)) film such as a trisilicon tetranitride ($Si_3N_4$) film, or a silicon oxynitride (SiON) film; and an organic film, for example, a polyimide resin film, an acrylic resin film, a polysiloxane resin film, or a novolak resin film.

As illustrated in FIG. 2, the plurality of organic EL layers 16 are provided in a matrix pattern, each being arranged on each first electrode 14 and each corresponding to each subpixel. Here, as illustrated in FIG. 4, the organic EL layers 16 each include a hole injection layer 1, a hole transport layer 2, a light-emitting layer 3, an electron transport layer 4, and an electron injection layer 5, which are provided in the order stated, over the first electrode 14.

The hole injection layer 1 is also referred to as an anode buffer layer, and functions to reduce the energy level difference between the first electrode 14 and the organic EL layer 16, to improve the efficiency of hole injection into the organic EL layer 16 from the first electrode 14. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Here, examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons recombine, when a voltage is applied via the first electrode 14 and the second electrode 17, the holes and electrons are injected from the first electrode 14 and the second electrode 17, respectively. The light-emitting layer 3 is formed of a material having high light-emitting efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce the energy level difference between the second electrode 17 and the organic EL layer 16, to improve the efficiency of electron injection into the organic EL layer 16 from the second electrode 17. Because of this function, the driving voltage for the organic EL element 19 can be reduced. Note that the electron injection layer 5 is also referred to as a cathode buffer layer. Here, examples of materials that may constitute the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$), and strontium oxide (SrO).

As illustrated in FIG. 2, the second electrode 17 is disposed to cover the organic EL layers 16 and the edge cover 15. The second electrode 17 functions to inject electrons into the organic EL layer 16. It is further preferable that the second electrode 17 includes a material having a small work function to improve the efficiency of electron injection into the organic EL layer 16. Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 17 may be formed of alloys such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al), for example. Examples of materials that may be included in the second electrode 17 include electrically conductive oxides, examples of which include tin oxide (SnO), zinc oxide (ZnO), indium tin oxide (ITO), and indium zinc oxide (IZO). The second electrode 17 may include a stack of a plurality of layers of any of the above-mentioned materials. Note that, examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 2, the sealing film 18 is provided to cover the second electrode 17, and functions to protect the organic EL layer 16 from moisture and oxygen. Here, examples of materials that may be included in the sealing film 18 include inorganic materials, example of which include silicon oxide ($SiO_2$), aluminum oxide ($Al_2O_3$), silicon nitride (SiNx (x is a positive number)) such as trisilicon tetranitride ($Si_3N_4$), and silicon carbon nitride (SiCN); and organic materials, example of which include acrylate, polyurea, parylene, polyimide, and polyamide.

The front surface side protection layer 25a and the back surface side protection layer 25b are each formed with, for example, a polyimide resin film or the like with a thickness of approximately 2 μm.

As illustrated in FIG. 5, the organic EL display device 30a includes, in the frame region F, the resin substrate layer 10, an inorganic layered film L provided on the front surface of the resin substrate layer 10, a frame flattening film 21a as a first organic film provided to plug a first opening Aa of the inorganic layered film L, a plurality of frame wiring lines 12ea provided on the front surfaces of the inorganic layered film L and the frame flattening film 21a to extend in parallel to one another, and the TFT flattening film 13a provided to cover the frame wiring lines 12ea as a second organic film. Here, the first opening Aa is formed as a slit that opens upward in the inorganic layered film L in a cross section from the display region D to the terminal section T (see FIG. 5) and passes through the inorganic layered film L.

As illustrated in FIG. 5, the inorganic layered film L includes the base coat film 11, the gate insulating film 12a, the first interlayer insulating film 12c, and the second interlayer insulating film 12d, which are layered in the order stated, over the resin substrate layer 10. As illustrated in FIG. 5, the inorganic layered film L has the first opening Aa passing therethrough in the thickness direction, and hence is not provided to the bending section B from one end of the organic EL display device 30a (upper side in FIG. 1) to the other end (lower side in FIG. 1). As illustrate in FIG. 5, between the gate insulating film 12a and the first interlayer insulating film 12c in the inorganic layered film L, a first gate conductive layer 12ba and a second gate conductive layer 12bb are provided. The first gate conductive layer 12ba is connected to a signal wiring line (for example, gate line, source line, and power supply line) of the organic EL element 19 in the display region D. The second gate conductive layer 12bb is provided to extend to the terminal section T. Note that the front surface side protection layer 25a and the back surface side protection layer 25b that are arranged in the display region D are also provided in the most part of the frame region F, but are not provided at the bending section B of the frame region F. In the present embodiment, the first opening Aa passing through the inorganic layered film L is given as an example. However, the first opening Aa may be formed to leave (a part of) the inorganic insulating film of the inorganic layered film L on the resin substrate layer 10 side.

The frame flattening film 21a is formed of, for example, an organic insulating film formed of a polyimide resin, an acrylic resin, or the like having a thickness of approximately from 1.5 μm to 2.5 μm. As illustrated in FIG. 5, at the bending section B, a second opening Ab is formed in the frame flattening film 21a. Here, the second opening Ab opens upward in the frame flattening film 21a in a cross section from the display region D to the terminal section T (see FIG. 5) on an inner side with respect to the first opening Aa. As illustrated in FIG. 5, the second opening Ab is formed to leave a part of (approximately 0.5 μm to 1.0 μm, for example) the frame flattening film 21a, and the film thickness of the frame flattening film 21a is smaller than the film thickness of the frame flattening film 21a on the edge of the second opening Ab. Thus, as illustrated in FIG. 5, the frame flattening film 21a is reduced in thickness at the bending section B due to the second opening Ab. Note that the second opening Ab has a width (a length in the lateral direction in FIG. 5) of approximately a few millimeters.

As illustrated in FIG. 5, at the bending section B, the frame wiring lines 12ea are provided to be sandwiched between the frame flattening film 21a and the TFT flattening film 13a. As illustrated in FIG. 5, both end portions of the frame wiring line 12ea are each connected to the first gate conductive layer 12ba and the second gate conductive layer 12bb via contact holes Ca and Cb formed through the layered film of the first interlayer insulating film 12c and the second interlayer insulating film 12d. The frame wiring line 12ea is formed with, for example, a metal layered film of a titanium film (with a thickness of approximately 100 nm)/an aluminum film (with a thickness of approximately 600 nm)/a titanium film (with a thickness of approximately 100 nm). Note that, although in the first embodiment, the example of the frame wiring line 12ea formed with a metal layered film is given, the frame wiring line 12ea may also be formed with a metal single layer film.

The organic EL display device 30a described above has flexibility, and is configured, in each subpixel, such that the light-emitting layer 3 of the organic EL layer 16 is caused to appropriately emit light via the first TFT 12ta and the second TFT 12tb so that images are displayed.

The organic EL display device 30a of the present embodiment can be manufactured as described below.

For example, the organic EL display device 30a can be manufactured such that a TFT layer 29 and an organic EL element 19 are formed, using a well-known method, on the front surface of a resin substrate layer 10 formed on a glass substrate, a front surface side protection layer 25a is applied to the organic EL element 19 via an adhesive layer, and then a back surface side protection layer 25b is applied to the back surface of the resin substrate layer 10, from which the glass substrate has been peeled off, via an adhesive layer. The frame flattening film 21a in the frame region F is formed, before the formation of the source electrode and the drain electrode of the first TFT 12ta (the second TFT 12tb) that are included in the TFT layer 29, by forming and patterning using a photomask Ma (see FIG. 5) such as a halftone mask and a graytone mask after forming a photosensitive organic insulating film such as a polyimide resin film in the frame region F alone. The frame wiring line 12ea in the frame region F is formed when the source electrode and the drain electrode of the first TFT 12ta (the second TFT 12tb) that are included in the TFT layer 29 are formed.

As described above, with the organic EL display device 30a according to the present embodiment, at the bending section B of the frame region F, the first opening Aa is formed in the inorganic layered film L included in the TFT layer 29, the frame flattening film 21a is provided to plug the first opening Aa, the frame wiring lines 12ea are provided on the frame flattening film 21a, and the TFT flattening film 13a is provided to cover the frame wiring lines 12ea. Here, at the bending section B, in the frame flattening film 21a, the second opening Ab is formed on the inner side with respect to the first opening Aa. With this, the frame flattening film 21a is reduced in thickness at the bending section B, and hence bendability at the bending section B of the frame region F can be enhanced.

In addition, with the organic EL display device 30a according to the present embodiment, the first opening Aa is formed to pass through the inorganic layered film L, and hence film breaking of the inorganic layered film L at the bending section B of the frame region F can be suppressed.

With the organic EL display device 30a according to the present embodiment, between the end surface of the first opening Aa of the inorganic layered film L and the frame wiring lines 12ea, the frame flattening film 21a is provided as a cushioning member, and hence breakage of the frame wiring lines 12ea can be suppressed.

SECOND EMBODIMENT

Figure 6:
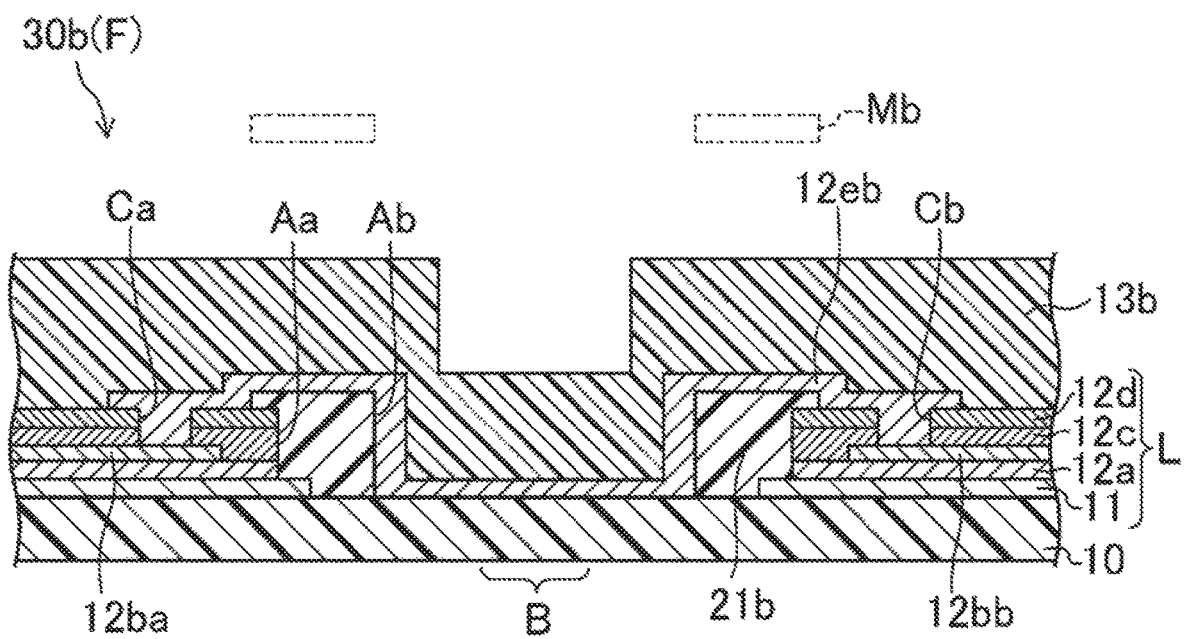
FIG. 6 is a cross-sectional view illustrating an overall configuration of a frame region of an organic EL display device according to a second embodiment of the disclosure, which corresponds to FIG. 5.

FIG. 6 illustrates a second embodiment of the display device according to the disclosure. Here, FIG. 6 is a cross-sectional view illustrating an overall configuration of a frame region of an organic EL display device 30b according to the present embodiment, which corresponds to FIG. 5.

In the first embodiment, the organic EL display device 30a including the frame flattening film 21a in which the second opening Ab that does not pass through in the thickness direction is exemplified. In the present embodiment, the organic EL display device 30b including a frame flattening film 21b in which the second opening Ab that passes through in the thickness direction.

The organic EL display device 30b, like the organic EL display device 30a of the first embodiment described above, includes a display region D and the frame region F defined in the periphery of the display region D.

The display region D of the organic EL display device 30b has the same configuration as the organic EL display device 30a according to the first embodiment described above.

As illustrated in FIG. 6, the organic EL display device 30b includes, in the frame region F, the resin substrate layer 10, the inorganic layered film L provided on the front surface of the resin substrate layer 10, a frame flattening film 21b as a first organic film provided to plug the first opening Aa of the inorganic layered film L, a plurality of frame wiring lines 12eb provided on the front surfaces of the inorganic layered film L, the frame flattening film 21b, and the resin substrate layer 10 to extend in parallel to one another, and the TFT flattening film 13b provided to cover the frame wiring lines 12eb as a second organic film. Here, the first opening Aa is formed as a slit that opens upward in the inorganic layered film L in a cross section from the display region D to the terminal section T (see FIG. 6) and passes through the inorganic layered film L.

The frame flattening film 21b is formed of, for example, an organic insulating film formed of a polyimide resin, an acrylic resin, or the like having a thickness of approximately from 1.5 μm to 2.5 μm. As illustrated in FIG. 6, at the bending section B, the second opening Ab is formed in the frame flattening film 21b. Here, the second opening Ab opens upward in the frame flattening film 21b in a cross section from the display region D to the terminal section T (see FIG. 6) on an inner side with respect to the first opening Aa. As illustrated in FIG. 6, the second opening Ab is formed to pass through the frame flattening film 21b. Thus, as illustrated in FIG. 6, the frame flattening film 21b is not provided at the bending section B from one end to the other end of the organic EL display device 30b due to the second opening Ab.

As illustrated in FIG. 6, the frame wiring line 12eb is provided, at the bending section B, being interposed between the resin substrate layer 10 and the TFT flattening film 13b. As illustrated in FIG. 6, both end portions of the frame wiring line 12eb are each connected to the first gate conductive layer 12ba and the second gate conductive layer 12bb via contact holes Ca and Cb formed through the layered film of the first interlayer insulating film 12c and the second interlayer insulating film 12d. The frame wiring line 12eb is formed with, for example, a metal layered film of a titanium film (with a thickness of approximately 100 nm)/an aluminum film (with a thickness of approximately 600 nm)/a titanium film (with a thickness of approximately 100 nm). Note that, in the present embodiment, the example of the frame wiring line 12eb formed with a metal layered film is given. However, the frame wiring line 12eb may be formed with a metal single layer film.

The TFT flattening film 13b is formed of, for example, a colorless and transparent organic insulating film formed of a polyimide resin, an acrylic resin, or the like having a thickness of approximately from 2 μm to 2.5 μm.

The organic EL display device 30b described above has flexibility, and is configured, in each subpixel, such that the light-emitting layer 3 of the organic EL layer 16 is caused to appropriately emit light via the first TFT 12ta and the second TFT 12tb so that images are displayed.

The organic EL display device 30b according to the present embodiment can be manufactured with the manufacturing method described above in the first embodiment by changing the multi-gradation photomask Ma used for forming the frame flattening film 21a to a binary photomask Mb (see FIG. 6).

As described above, with the organic EL display device 30b according to the present embodiment, at the bending section B of the frame region F, the first opening Aa is formed in the inorganic layered film L included in the TFT layer 29, the frame flattening film 21b is provided to plug the first opening Aa, the frame wiring lines 12eb are provided on the frame flattening film 21b, and the TFT flattening film 13b is provided to cover the frame wiring lines 12eb. Here, at the bending section B, in the frame flattening film 21b, the second opening Ab is formed on the inner side with respect to the first opening Aa. With this, the frame flattening film 21b is not provided at the bending section B, and hence bendability at the bending section B of the frame region F can be enhanced.

In addition, with the organic EL display device 30b according to the present embodiment, the first opening Aa is formed to pass through the inorganic layered film L, and hence film breaking of the inorganic layered film L at the bending section B of the frame region F can be suppressed.

With the organic EL display device 30b according to the present embodiment, between the end surface of the first opening Aa of the inorganic layered film L and the frame wiring lines 12eb, the frame flattening film 21b is provided as a cushioning member, and hence breakage of the frame wiring lines 12eb can be suppressed.

THIRD EMBODIMENT

Figure 7:
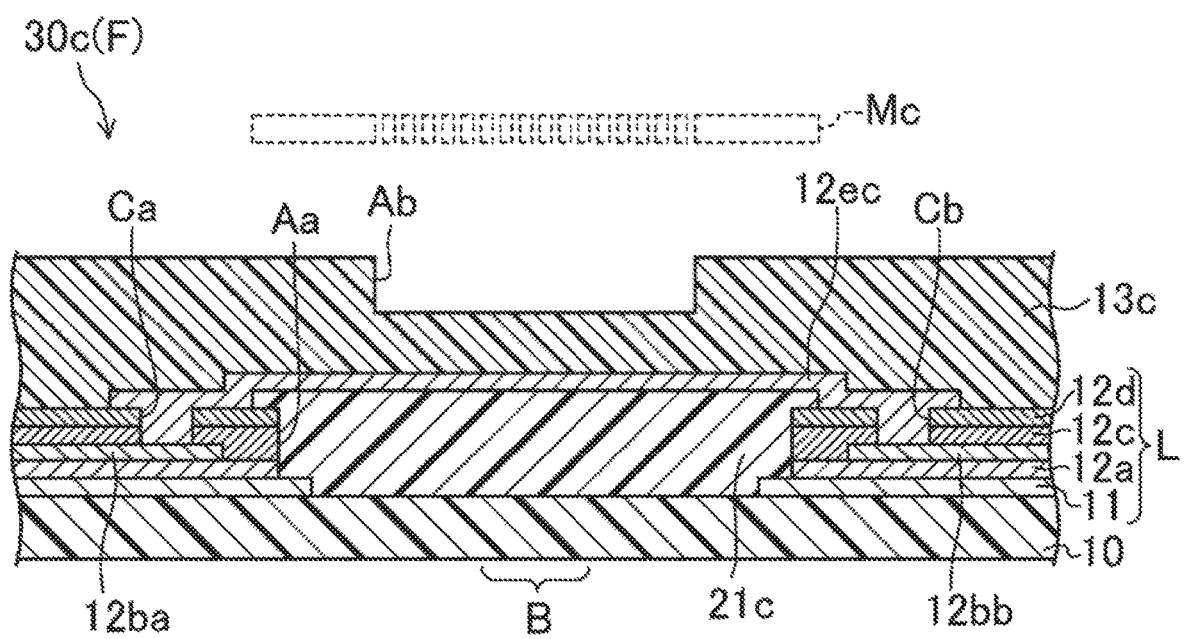
FIG. 7 is a cross-sectional view illustrating an overall configuration of a frame region of an organic EL display device according to a third embodiment of the disclosure, which corresponds to FIG. 5.

FIG. 7 illustrates a third embodiment of the display device according to the disclosure. Here, FIG. 7 is a cross-sectional view illustrating an overall configuration of a frame region F of an organic EL display device 30c according to the present embodiment, which corresponds to FIG. 5.

In the first embodiment and the second embodiment described above, the organic EL display devices 30a and 30b in which the second opening Ab is formed in the frame flattening films 21a and 21b are exemplified. However, in the present embodiment, the organic EL display device 30c in which the second opening Ab is formed in a TFT flattening film 13c is exemplified.

The organic EL display device 30c, like the organic EL display device 30a of the first embodiment described above, includes a display region D and the frame region F defined in the periphery of the display region D.

The display region D of the organic EL display device 30c has the same configuration as the organic EL display device 30a according to the first embodiment described above.

As illustrated in FIG. 7, the organic EL display device 30c includes, in the frame region F, the resin substrate layer 10, an inorganic layered film L provided on the front surface of the resin substrate layer 10, a frame flattening film 21c as a first organic film provided to plug a first opening Aa of the inorganic layered film L, a plurality of frame wiring lines 12ec provided on the front surfaces of the inorganic layered film L and the frame flattening film 21c to extend in parallel to one another, and the TFT flattening film 13c as a second organic film provided to cover the frame wiring lines 12ec. Here, the first opening Aa is formed as a slit that opens upward in the inorganic layered film L in a cross section from the display region D to the terminal section T (see FIG. 7) and passes through the inorganic layered film L.

The frame flattening film 21c is formed of, for example, an organic insulating film formed of a polyimide resin, an acrylic resin, or the like having a thickness of approximately from 1.5 μm to 2.5 μm.

As illustrated in FIG. 7, at the bending section B, the frame wiring lines 12ec are provided to be sandwiched between the frame flattening film 21c and the TFT flattening film 13c. As illustrated in FIG. 7, both end portions of the frame wiring line 12ec are each connected to the first gate conductive layer 12ba and the second gate conductive layer 12bb via contact holes Ca and Cb formed through the layered film of the first interlayer insulating film 12c and the second interlayer insulating film 12d. The frame wiring line 12ec is formed with, for example, a metal layered film of a titanium film (with a thickness of approximately 100 nm)/an aluminum film (with a thickness of approximately 600 nm)/a titanium film (with a thickness of approximately 100 nm). Note that, in the present embodiment, the example of the frame wiring line 12ec formed with a metal layered film is given. However, the frame wiring line 12ec may be formed with a metal single layer film.

The TFT flattening film 13c is formed of, for example, a colorless and transparent organic insulating film formed of a polyimide resin, an acrylic resin, or the like having a thickness of approximately from 2 μm to 2.5 μm. As illustrated in FIG. 7, in the TFT flattening film 13c, the second opening Ab is formed to be located inside the first opening Aa. Here, the second opening Ab opens upward in the TFT flattening film 13c in a cross section from the display region D to the terminal section T (see FIG. 7) on an inner side with respect to the first opening Aa. As illustrated in FIG. 7, the second opening Ab is formed to leave a part of (approximately 0.5 μm to 1.5 μm, for example) the TFT flattening film 13c, and the film thickness of the TFT flattening film 13c is smaller than the film thickness of the TFT flattening film 13c on the edge of the second opening Ab. Thus, as illustrated in FIG. 7, the TFT flattening film 13c is reduced in thickness at the bending section B from one end to the other end of the organic EL display device 30c due to the second opening Ab.

The organic EL display device 30c described above has flexibility, and is configured, in each subpixel, such that the light-emitting layer 3 of the organic EL layer 16 is caused to appropriately emit light via the first TFT 12ta and the second TFT 12tb so that images are displayed.

The organic EL display device 30c according to the present embodiment can be manufactured with the manufacturing method described in the first embodiment by changing a pattern shape of the frame flattening film 21a and changing a pattern shape of the TFT flattening film 13a through use of a photomask Mc (see FIG. 7) such as a halftone mask and a graytone mask.

As described above, with the organic EL display device 30c according to the present embodiment, at the bending section B of the frame region F, the first opening Aa is formed in the inorganic layered film L included in the TFT layer 29, the frame flattening film 21c is provided to plug the first opening Aa, the frame wiring lines 12ec are provided on the frame flattening film 21c, and the TFT flattening film 13c is provided to cover the frame wiring lines 12ec. Here, at the bending section B, in the TFT flattening film 13c, the second opening Ab is formed on the inner side with respect to the first opening Aa. With this, the TFT flattening film 13c is reduced in thickness at the bending section B, bendability at the bending section B of the frame region F can be enhanced.

With the organic EL display device 30c according to the present embodiment, the first opening Aa is formed to pass through the inorganic layered film L, and hence film breaking of the inorganic layered film L at the bending section B of the frame region F can be suppressed.

With the organic EL display device 30c according to the present embodiment, between the end surface of the first opening Aa of the inorganic layered film L and the frame wiring lines 12ec, the frame flattening film 21c is provided as a cushioning member, and hence breakage of the frame wiring lines 12ec can be suppressed.

FOURTH EMBODIMENT

Figure 8:
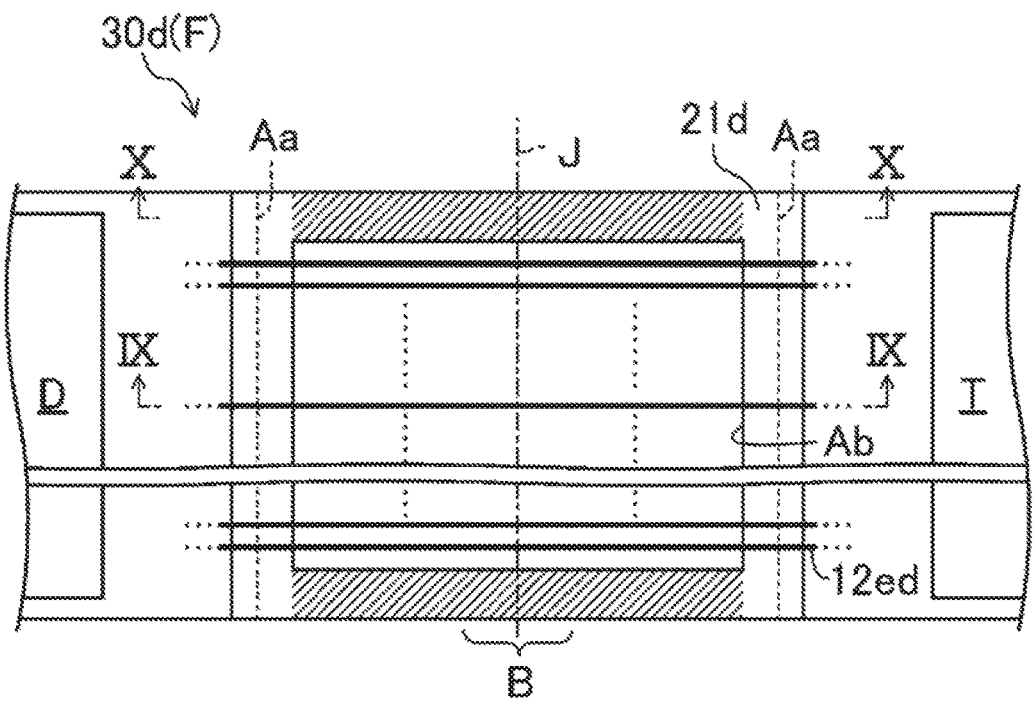
FIG. 8 is a plan view illustrating an overall configuration of a frame region of an organic EL display device according to a fourth embodiment of the disclosure.
Figure 9:
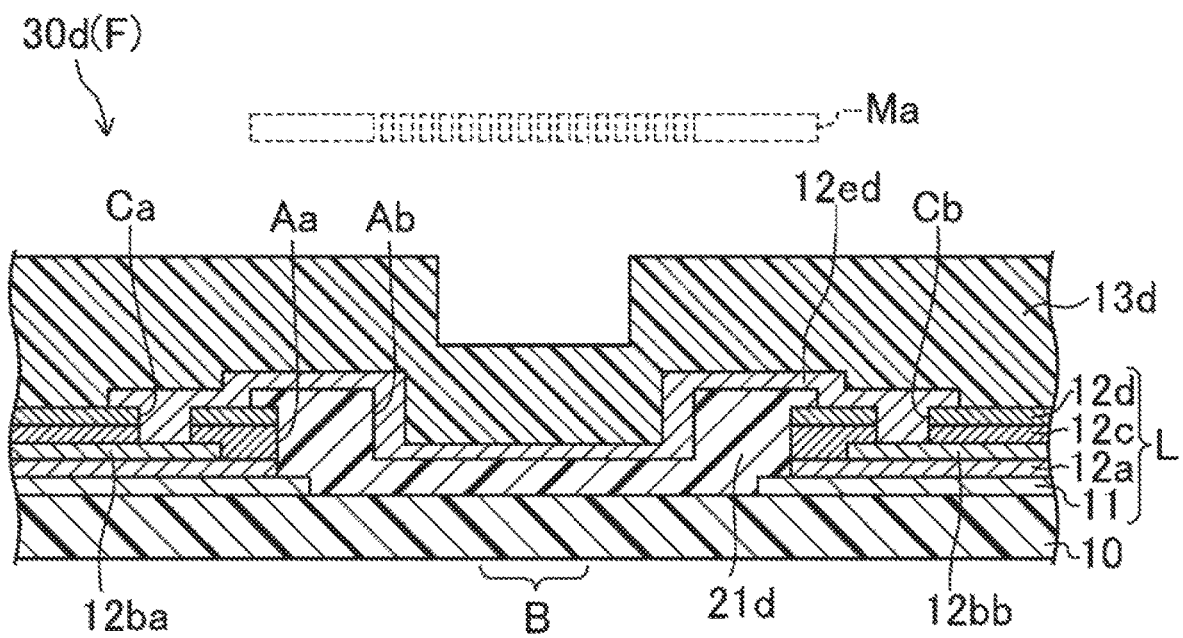
FIG. 9 is a cross-sectional view illustrating an overall configuration of the frame region of the organic EL display device, which is taken along the line IX-IX in FIG. 8 and corresponds to FIG. 5.
Figure 10:
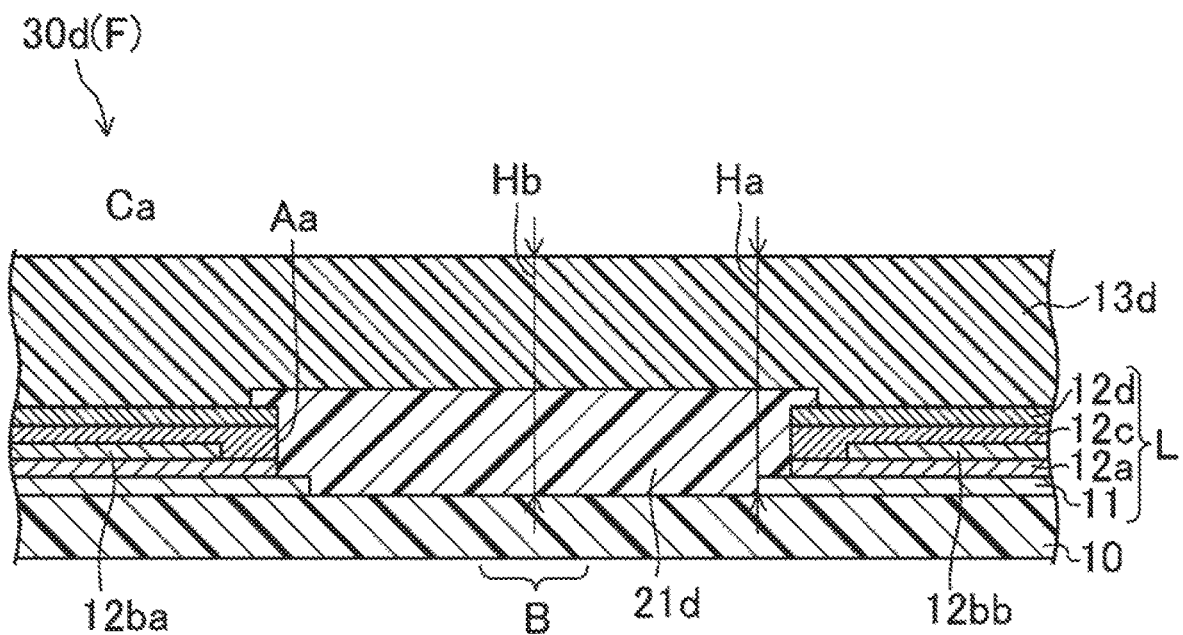
FIG. 10 is a cross-sectional view illustrating an overall configuration of the frame region of the organic EL display device, which is taken along the line X-X in FIG. 8.

FIG. 8 to FIG. 10 illustrate a display device according to a fourth embodiment of the disclosure. Here, FIG. 8 is a plan view illustrating an overall configuration of the frame region F of an organic EL display device 30d according to the present embodiment. FIG. 9 is a cross-sectional view illustrating an overall configuration of the frame region F of the organic EL display device 30d, which is taken along the line IX-IX in FIG. 8 and corresponds to FIG. 5. FIG. 10 is a cross-sectional view illustrating an overall configuration of the frame region of the organic EL display device, which is taken along the line X-X in FIG. 8. Note that, in FIG. 8, a TFT flattening film 13d formed on the front surface, which is described later, is omitted.

In the first embodiment, the second embodiment, and the third embodiment, the organic EL display devices 30a, 30b, and 30c in which the second opening Ab is formed to the end surface of the resin substrate layer 10 is exemplified. In the present embodiment, the organic EL display device 30d in which the second opening Ab is not formed to the end surface of the resin substrate layer 10 is exemplified.

The organic EL display device 30d, like the organic EL display device 30a of the first embodiment described above, includes a display region D and the frame region F defined in the periphery of the display region D.

The display region D of the organic EL display device 30d has the same configuration as the organic EL display device 30a according to the first embodiment described above.

As illustrated in FIG. 9 and FIG. 10, the organic EL display device 30d includes, in the frame region F, the resin substrate layer 10, the inorganic layered film L provided on the front surface of the resin substrate layer 10, a frame flattening film 21d as a first organic film provided to plug the first opening Aa of the inorganic layered film L, a plurality of frame wiring lines 12ed provided on the front surfaces of the inorganic layered film L and the frame flattening film 21d to extend in parallel to one another, and the TFT flattening film 13d as a second organic film provided to cover the frame wiring lines 12ed. Here, the first opening Aa is formed as a slit that opens upward in the inorganic layered film L in a cross section from the display region D to the terminal section T (see FIG. 9 and FIG. 10) and passes through the inorganic layered film L.

The frame flattening film 21d is formed of, for example, an organic insulating film formed of a polyimide resin, an acrylic resin, or the like having a thickness of approximately from 1.5 µm to 2.5 µm. Here, as illustrated in FIG. 8, FIG. 9, and FIG. 10, at the bending section B, the second opening Ab having a rectangular shape is formed in the frame flattening film 21d. Here, the second opening Ab opens upward in the frame flattening film 21d in a cross section from the display region D to the terminal section T (see FIG. 9) on an inner side with respect to the first opening Aa. As illustrated in FIG. 8, the second opening Ab is formed to leave a part of the frame flattening film 21d, which corresponds to both the ends of the resin substrate layer 10 along the bending axis J of the bending section B, and the film thickness of the frame flattening film 21d at the middle portion of the second opening Ab along the bending axis J of the bending section B is smaller than the thickness of the frame flattening film 21d at both the edges of the second opening Ab along the bending axis J of the bending section B. Thus, at both the ends of the resin substrate layer 10 along the bending axis J of the bending section B, in a cross section from the display region D to the terminal section T (see FIG. 10), a height Ha at the ends of the first opening Aa from the upper surface of the resin substrate layer to the upper surface of the TFT flattening film 13d is equal to a height Hb at the middle portion of the first opening Aa (bending axis J) from the upper surface of the resin substrate layer 10 to the upper surface of TFT flattening film 13d. As illustrated in FIG. 9, the second opening Ab is formed to leave a part of (for example, approximately from 0.5 µm to 1.0 µm) the frame flattening film 21d. Thus, the frame flattening film 21d is reduced in thickness at the bending section B due to the second opening Ab. Note that the frame flattening films 21a to 21c described in the first embodiment to the third embodiment each have a planar shape obtained by removing the hatched portion on the frame flattening film 21d in FIG. 8.

As illustrated in FIG. 9, at the bending section B, the frame wiring lines 12ed are provided to be sandwiched between the frame flattening film 21d and the TFT flattening film 13d. As illustrated in FIG. 9, both end portions of the frame wiring line 12ed are each connected to the first gate conductive layer 12ba and the second gate conductive layer 12bb via contact holes Ca and Cb formed through the layered film of the first interlayer insulating film 12c and the second interlayer insulating film 12d. The frame wiring line 12ed is formed with, for example, a metal layered film of a titanium film (with a thickness of approximately 100 nm)/an aluminum film (with a thickness of approximately 600 nm)/a titanium film (with a thickness of approximately 100 nm). Note that, in the present embodiment, the example of the frame wiring line 12ed formed with a metal layered film is given. However, the frame wiring line 12ed may be formed with a metal single layer film.

The TFT flattening film 13d is formed of, for example, a colorless and transparent organic insulating film formed of a polyimide resin, an acrylic resin, or the like having a thickness of approximately from 2 µm to 2.5 µm.

The organic EL display device 30d described above has flexibility, and is configured, in each subpixel, such that the light-emitting layer 3 of the organic EL layer 16 is caused to appropriately emit light via the first TFT 12ta and the second TFT 12tb so that images are displayed.

The organic EL display device 30d according to the present embodiment can be manufactured with the manufacturing method described above in the first embodiment by, for example, changing a pattern shape of the frame flattening film 21a.

Note that, in the present embodiment, an example in which the configuration of the frame wiring line 12ed is the same as that of the frame wiring line 12ea of the organic EL display device 30a according to the first embodiment is given. However, the configuration of the frame wiring line 12ed may be the same as those of the frame wiring lines 12eb and 12ec of the organic EL display devices 30b and 30c according to the second embodiment and the third embodiment.

As described above, with the organic EL display device 30d according to the present embodiment, at the bending section B of the frame region F, the first opening Aa is formed in the inorganic layered film L included in the TFT layer 29, the frame flattening film 21d is provided to plug the first opening Aa, the frame wiring lines 12ed are provided on the frame flattening film 21d, and the TFT flattening film 13d is provided to cover the frame wiring lines 12ed. Here, at the bending section B, in the frame flattening film 21d, the second opening Ab is formed on the inner side with respect to the first opening Aa. With this, the frame flattening film 21d is reduced in thickness at the bending section B, and hence bendability at the bending section B of the frame region F can be enhanced.

With the organic EL display device 30d according to the present embodiment, the first opening Aa is formed to pass through the inorganic layered film L, and hence film breaking of the inorganic layered film L at the bending section B of the frame region F can be suppressed.

With the organic EL display device 30d according to the present embodiment, between the end surface of the first opening Aa of the inorganic layered film L and the frame wiring lines 12ed, the frame flattening film 21d is provided as a cushioning member, and hence breakage of the frame wiring lines 12ed can be suppressed.

With the organic EL display device 30d according to the present embodiment, at the second opening Ab formed in the frame flattening film 21d, the film thickness of the frame flattening film 21d at both the edges of the second opening Ab along the bending axis J of the bending section B is larger than the film thickness of the frame flattening film 21d at the middle portion of the second opening Ab along the bending axis J of the bending section B. Thus, both the end portions of the organic EL display device 30d along the bending axis J of the bending section B can be reinforced.

OTHER EMBODIMENTS

In each of the embodiments described above, the organic EL display device in which the second opening is formed in the first organic film or the second organic film is exemplified. However, the disclosure is also applicable to an organic EL display device in which the second opening is formed in the first organic film and the second organic film.

In each of the embodiments described above, the organic EL layer of the five-layer structure including the hole injecting layer, the hole transport layer, the light-emitting layer, the electron transport layer, and the electron injecting layer is exemplified. The organic EL layer may include, for example, a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device, in which the layers of the structure of the organic EL layer are in the reverse order, with the first electrode being a cathode and the second electrode being an anode.

In each of the embodiments described above, the organic EL display device including an element substrate, in which the electrode of the TFT connected to the first electrode serves as the drain electrode, is exemplified. The disclosure is also applicable to an organic EL display device including an element substrate, in which the electrode of the TFT connected to the first electrode is referred to as the source electrode.

In each of the embodiments described above, the organic EL display device is exemplified as a display device. The disclosure can also be applied to a display device including a plurality of light-emitting elements driven by a current, for example, to a display device including quantum dot light-emitting diodes (QLEDs), which are a light-emitting element using a quantum dot-containing layer.

As described above, the disclosure is useful for a flexible display device.

The invention claimed is:
1. A display device comprising:
a resin substrate;
a light-emitting element included in a display region, the light-emitting element being provided above the resin substrate with a TFT layer in between;
a frame region provided in a periphery of the display region;
a terminal section provided at an end of the frame region;
a bending section provided between the display region and the terminal section;
a frame wiring line provided in the frame region, the frame wiring line extending to the terminal section with being electrically coupled to the light-emitting element via the TFT layer; and
an at least one layer of inorganic film provided in the frame region, the at least one layer of inorganic film being included in the TFT layer layered on the resin substrate,
wherein the at least one layer of inorganic film, a first organic film, the frame wiring line, and a second organic film are provided in the stated order from the display region to the terminal section,
in a cross section at the bending section, a first opening that opens upward is formed in the at least one layer of inorganic film,
the first organic film is provided to plug the first opening,
the frame wiring line is provided on the first organic film,
the second organic film is provided to cover the frame wiring line,
a second opening that opens upward is formed in the first organic film on an inner side with respect to the first opening,
in the cross section, a width of the first opening and a width of the second opening are larger than a width of the bending section, and
in the cross section, a thickness of the first organic film below the second opening is smaller than a thickness of the first organic film between the first opening and the second opening, and an end of the first opening is positioned away from an end of the second opening.

2. The display device according to claim 1,
wherein the second opening formed in the first organic film is provided to pass through the first organic film.

3. The display device according to claim 1,
wherein at the second opening formed in the first organic film, a film thickness of the first organic film at a middle portion of the second opening along a bending axis of the bending section is smaller than a film thickness of the first organic film at both edges of the second opening along the bending axis of the bending section.

4. The display device according to claim 1,
wherein the first opening is a slit passing through the at least one layer of inorganic film.

5. The display device according to claim 1,
wherein the light-emitting element is an organic EL element.

6. The display device according to claim 1,
wherein the resin substrate, the first organic film, and the second organic film are each formed of a polyimide resin.

7. The display device according to claim 1,
wherein in the cross section, the bending section includes an area in which a length between an under surface of the resin substrate and an upper surface of the second organic film is larger smaller than a length between the under surface of the resin substrate and the upper surface of the second organic film in an outer area of the bending section.

8. A display device comprising:
a resin substrate;
a light-emitting element included in a display region, the light-emitting element being provided above the resin substrate with a TFT layer in between;
a frame region provided in a periphery of the display region;
a terminal section provided at an end of the frame region;
a bending section provided between the display region and the terminal section;
a frame wiring line provided in the frame region, the frame wiring line extending to the terminal section with being electrically coupled to the light-emitting element via the TFT layer; and
an at least one layer of inorganic film provided in the frame region, the at least one layer of inorganic film being included in the TFT layer layered on the resin substrate,
wherein the at least one layer of inorganic film, a first organic film, the frame wiring line, and a second organic film are provided in the stated order from the display region to the terminal section,
in a cross section at the bending section, a first opening that opens upward is formed in the at least one layer of inorganic film,
the first organic film is provided to plug the first opening,
the frame wiring line is provided on the first organic film,
the second organic film is provided to cover the frame wiring line,
a second opening that opens upward is formed in the second organic film on an inner side with respect to the first opening, and
in the cross section, a width of the first opening and a width of the second opening are larger than a width of the bending section.

9. The display device according to claim 8,
wherein the second opening formed in the second organic film is formed by setting a film thickness of the second organic film to be smaller than a film thickness of the second organic film at an edge of the second opening.

10. A display device comprising:
a resin substrate;
a light-emitting element included in a display region, the light-emitting element being provided above the resin substrate with a TFT layer in between;
a frame region provided in a periphery of the display region;
a terminal section provided at an end of the frame region;
a bending section provided between the display region and the terminal section;
a frame wiring line provided in the frame region, the frame wiring line extending to the terminal section with being electrically coupled to the light-emitting element via the TFT layer; and
an at least one layer of inorganic film provided in the frame region, the at least one layer of inorganic film being included in the TFT layer layered on the resin substrate,
wherein the at least one layer of inorganic film, a first organic film, the frame wiring line, and a second organic film are provided in the stated order from the display region to the terminal section,
in a cross section at the bending section, a first opening that opens upward is formed in the at least one layer of inorganic film,
the first organic film is provided to plug the first opening,
the frame wiring line is provided on the first organic film,
the second organic film is provided to cover the frame wiring line,
a second opening that opens upward is formed in the first organic film on an inner side with respect to the first opening,
in the cross section, a width of the first opening and a width of the second opening are larger than a width of the bending section,
wherein at the second opening formed in the first organic film, a film thickness of the first organic film at a middle portion of the second opening along a bending axis of the bending section is smaller than a film thickness of the first organic film at both edges of the second opening along the bending axis of the bending section, and
wherein at both the ends of the resin substrate along the bending axis of the bending section, a height from an upper surface of the resin substrate to an upper surface of the second organic film at an edge of the first opening in a cross section from the display region to the terminal section is equal to a height from an upper surface of the resin substrate to an upper surface of the second organic film at a middle portion of the first opening in the cross section from the display region to the terminal section.

* * * * *